(12) United States Patent
Tajima et al.

(10) Patent No.: US 10,847,307 B1
(45) Date of Patent: Nov. 24, 2020

(54) INDUCTOR COMPONENT AND ELECTRONIC COMPONENT

(71) Applicant: Murata Manufacturing Co., Ltd., Kyoto-fu (JP)

(72) Inventors: Shinya Tajima, Nagaokakyo (JP); Yasunari Nakashima, Nagaokakyo (JP); Yuta Shimoda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/927,910

(22) Filed: Jul. 13, 2020

(30) Foreign Application Priority Data

Aug. 7, 2019 (JP) ................................ 2019-145320

(51) Int. Cl.
*H01F 27/28* (2006.01)
*H01F 27/29* (2006.01)
*H01F 41/04* (2006.01)
*H05K 1/18* (2006.01)

(52) U.S. Cl.
CPC ....... *H01F 27/2804* (2013.01); *H01F 27/292* (2013.01); *H01F 41/043* (2013.01); *H05K 1/181* (2013.01); *H01F 2027/2809* (2013.01); *H05K 2201/1003* (2013.01)

(58) Field of Classification Search
CPC .. H01F 27/2804; H01F 27/292; H01F 41/043; H01F 2027/2809; H05K 1/181; H05K 2201/1003

USPC .......................................................... 174/260
See application file for complete search history.

(56) References Cited

U.S. PATENT DOCUMENTS

| | | | |
|---|---|---|---|
| 2009/0284896 A1* | 11/2009 | Sakaguchi | H01G 4/228 361/303 |
| 2010/0219925 A1* | 9/2010 | Yamamoto | H01F 41/041 336/199 |
| 2016/0012961 A1* | 1/2016 | Suzuki | H01F 27/2804 336/192 |
| 2016/0233027 A1* | 8/2016 | Iijima | H01G 4/12 |
| 2018/0218825 A1* | 8/2018 | Sato | H01F 27/292 |

FOREIGN PATENT DOCUMENTS

| | | |
|---|---|---|
| JP | 2015015297 A | 1/2015 |
| JP | 2017092447 A | 5/2017 |
| JP | 6252605 B2 | 12/2017 |
| JP | 2019036589 A | 3/2019 |

* cited by examiner

*Primary Examiner* — Sherman Ng
(74) *Attorney, Agent, or Firm* — Studebaker & Brackett PC

(57) ABSTRACT

An inductor component includes an element body, a coil provided in the element body, and an outer electrode provided at the element body and electrically connected to the coil. The element body includes a bottom surface that faces the mounting substrate when the element body is mounted, the outer electrode includes an underlying layer and a coating film that covers the underlying layer. At the bottom surface of the element body, the underlying layer is embedded in the element body and does not protrude from the element body, and at least part of the coating film is embedded in the element body.

20 Claims, 9 Drawing Sheets

INDUCTOR COMPONENT AND ELECTRONIC COMPONENT

CROSS-REFERENCE TO RELATED APPLICATION

This application claims benefit of priority to Japanese Patent Application No. 2019-145320, filed Aug. 7, 2019, the entire content of which is incorporated herein by reference.

BACKGROUND

Technical Field

The present disclosure relates to an inductor component and an electronic component.

Background Art

An inductor component is described in Japanese Unexamined Patent Application Publication No. 2015-15297. The inductor component includes an element body, a coil provided in the element body, and an outer electrode provided to the element body and electrically connected to the coil. The outer electrode includes an underlying layer embedded in the element body, and a coating film covering the underlying layer.

As for the inductor component in the related art, since the underlying layer is positioned on the cut line in the manufacturing stage, the exposed surface of the underlying layer exposed at the element body after being divided into individual components is positioned on the same plane as the bottom surface of the element body. Subsequently, the coating film is formed on the exposed surface of the underlying layer by a plating process.

Thus, the coating film is formed on the exposed surface of the underlying layer positioned on the same plane as the bottom surface of the element body. That is, the entire coating film protrudes from the element body at the bottom surface of the element body. Accordingly, when the inductor component is mounted on a mounting substrate with the bottom surface of the element body facing the mounting substrate, the bottom surface of the element body is apart from the mounting substrate by at least the thickness of the coating film. With this, the position of the center of gravity of the inductor component is high, and the posture of the inductor component mounted may be unstable.

SUMMARY

Accordingly, the present disclosure provides an inductor component and an electronic component in which a posture of the inductor component mounted is stabilized.

An inductor component according to an aspect of the present disclosure includes an element body, a coil provided in the element body, and an outer electrode provided to the element body and electrically connected to the coil, in which the element body includes a bottom surface that faces a mounting substrate when the element body is mounted, the outer electrode includes an underlying layer and a coating film that covers the underlying layer, at the bottom surface of the element body, the underlying layer is embedded in the element body without protruding from the element body, and at least part of the coating film is embedded in the element body.

According to the aspect above, at the bottom surface of the element body, the underlying layer is embedded in the element body without protruding from the element body, and at least part of the coating film is embedded in the element body. With this, when the inductor component is mounted on a mounting substrate, the bottom surface of the element body is close to the mounting substrate, and the position of the center of gravity of the inductor component is lowered, and it is thus possible to stabilize the posture of the inductor component mounted.

Other features, elements, characteristics and advantages of the present disclosure will become more apparent from the following detailed description of preferred embodiments of the present disclosure with reference to the attached drawings.

DETAILED DESCRIPTION

Hereinafter, an inductor component and an electronic component according to an aspect of the present disclosure are described in detail with reference to the illustrated embodiments. Note that the drawings include some schematic drawings, and the actual dimensions and ratios may not be reflected in some cases.

First Embodiment

Structure

Figure 1:
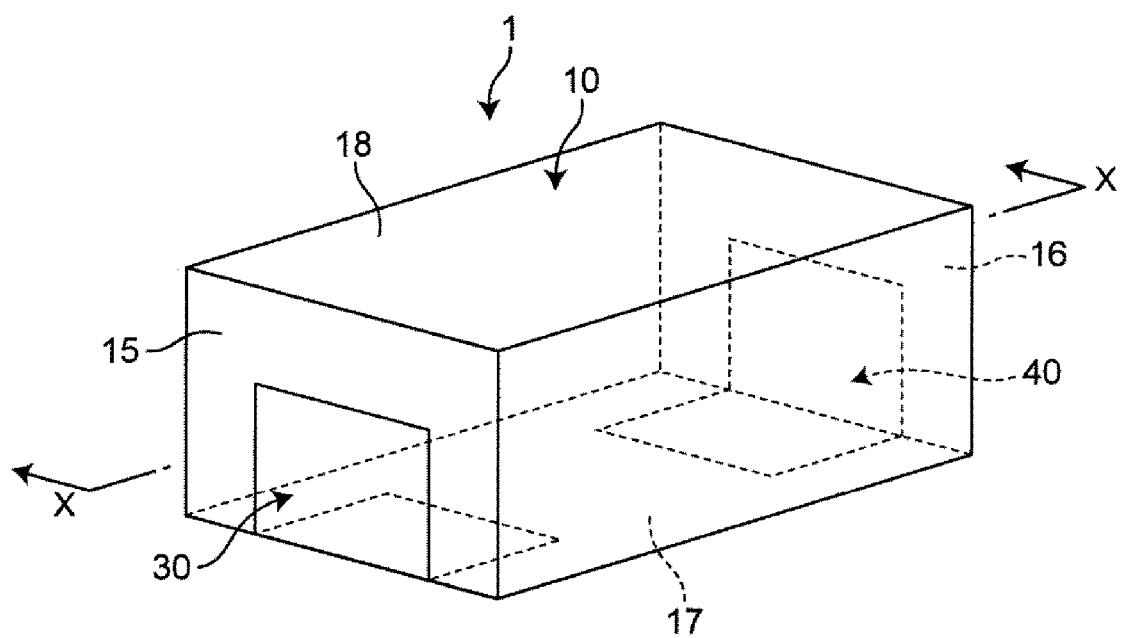
FIG. 1 is a perspective view illustrating a first embodiment of an inductor component.
Figure 2:
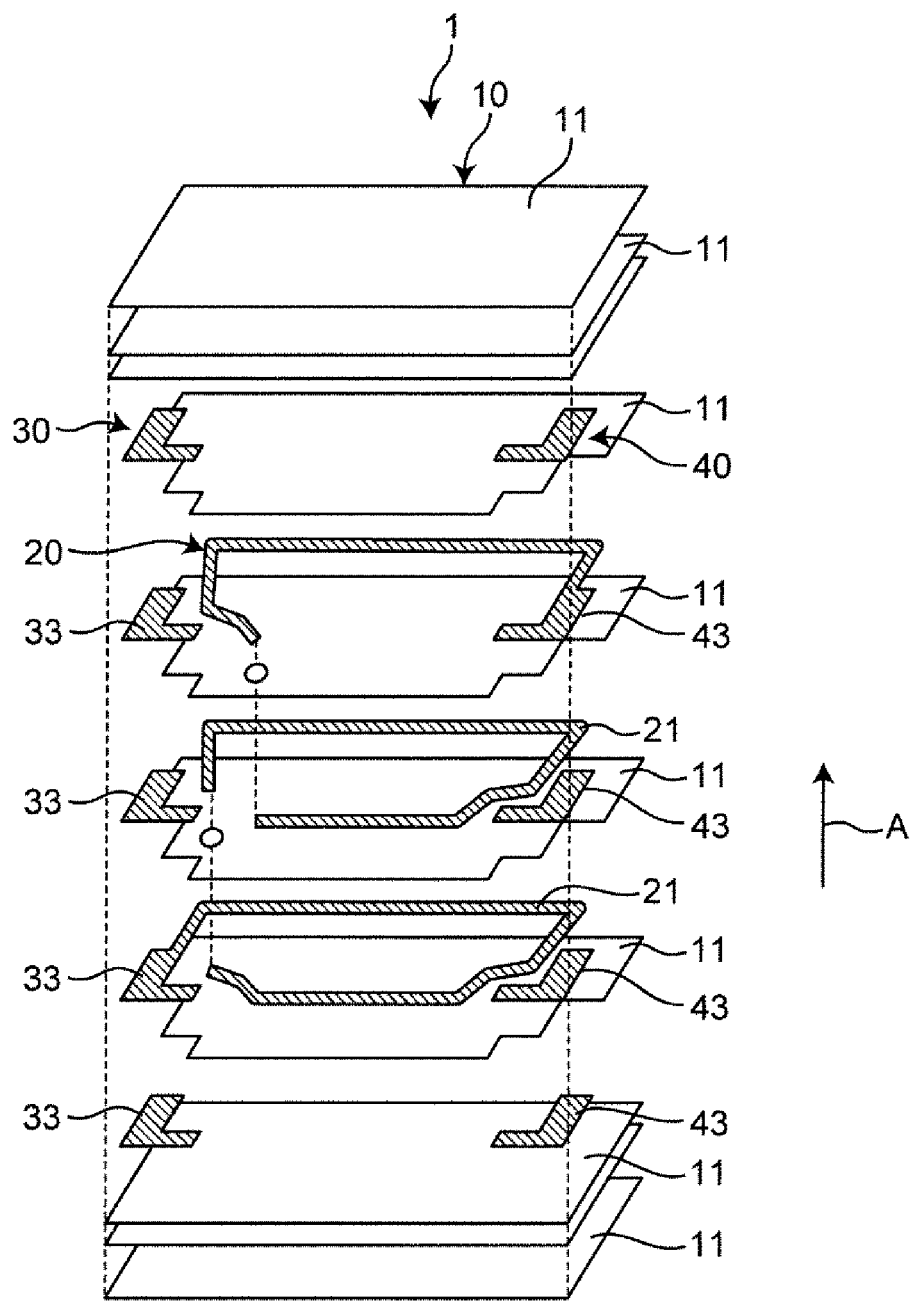
FIG. 2 is an exploded perspective view of the inductor component.
Figure 3:
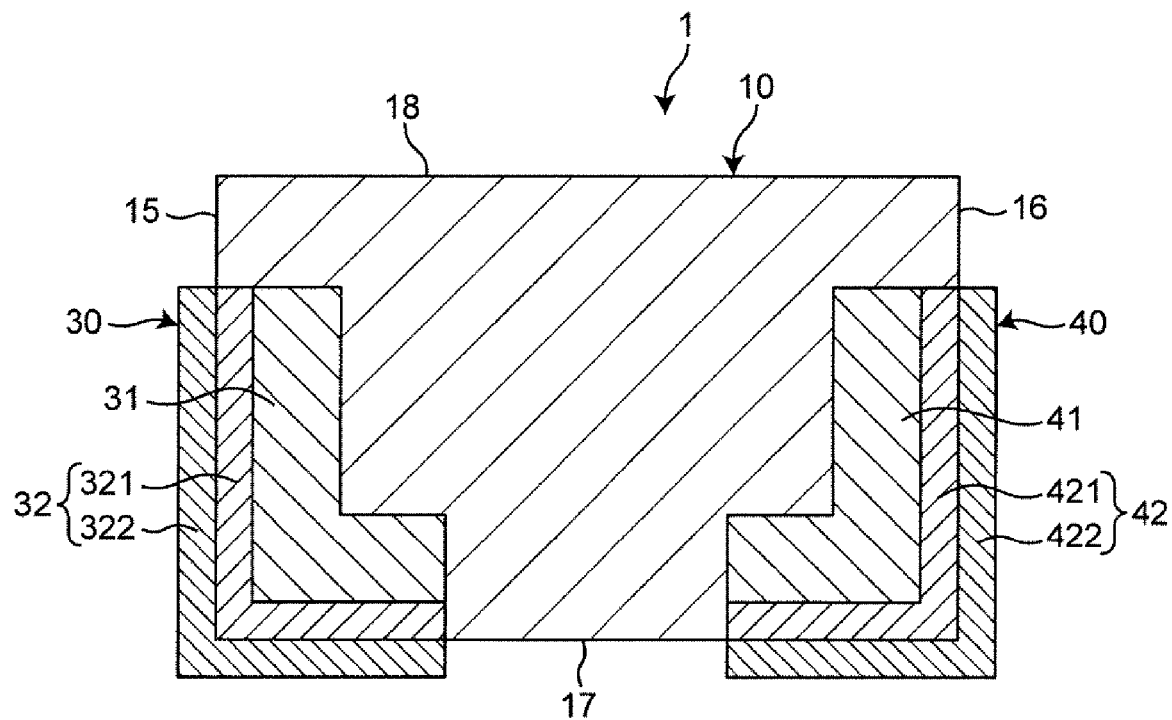
FIG. 3 is a sectional view of the inductor component taken along line X-X.
Figure 4:
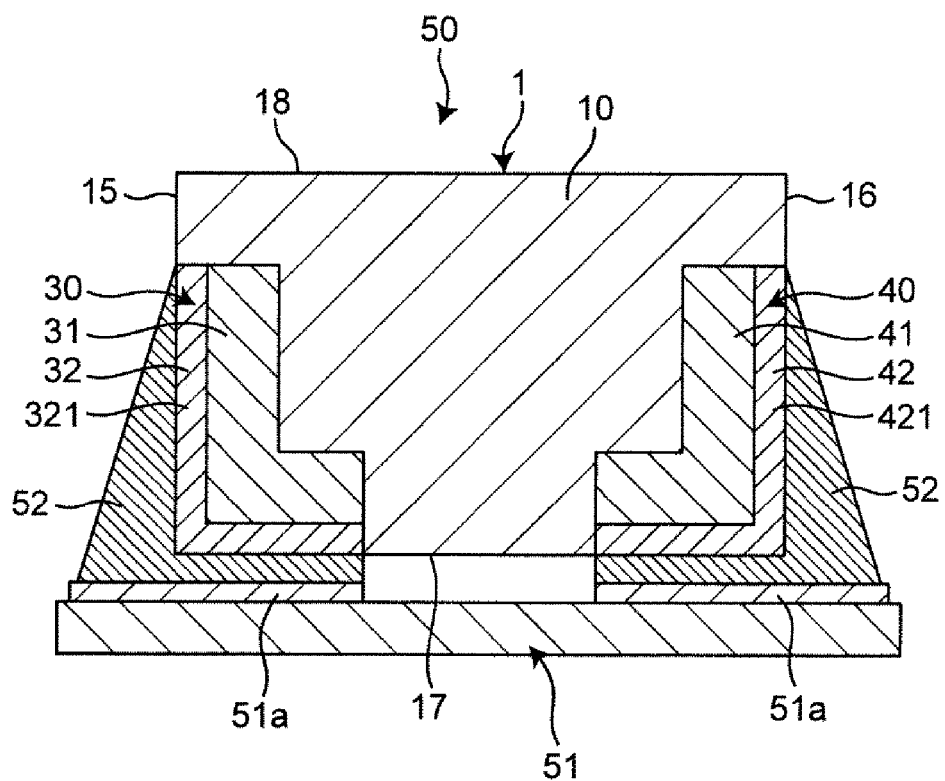
FIG. 4 is a sectional view illustrating a state in which the inductor component is mounted on a mounting substrate.

FIG. 1 is a perspective view illustrating a first embodiment of an inductor component. FIG. 2 is an exploded perspective view of the inductor component. FIG. 3 is a sectional view of FIG. 1 taken along line X-X. FIG. 4 is a sectional view illustrating a state in which the inductor component is mounted on a mounting substrate. As illustrated in FIG. 1, FIG. 2, and FIG. 3, an inductor component 1 includes an element body 10, a coil 20 in a spiral shape provided inside the element body 10, and a first outer electrode 30 and a second outer electrode 40 which are provided to the element body 10 and electrically connected to the coil 20. In FIG. 3, illustration of the coil 20 is omitted.

As illustrated in FIG. 4, the inductor component 1 (first outer electrode 30 and second outer electrode 40) is electrically connected, with a solder portion 52, to a wire 51a of a mounting substrate 51. The inductor component 1 is used as, for example, an impedance matching coil (matching coil) in a high frequency circuit, and is used in an electronic device such as a personal computer, a DVD player, a digital camera, a TV, a cellular phone, a car electronics, and a medical/industrial machine. However, the application of the inductor component 1 is not limited to the above and includes, for example, a tuning circuit, a filter circuit, a rectifying and smoothing circuit, or the like.

The element body 10 is formed by laminating a plurality of insulating layers 11 in a lamination direction A. Each insulating layer 11 is made of, for example, a material containing borosilicate glass as a main component, or a material such as ferrite or resin. Note that, in the element body 10, the interface between the plurality of insulating layers 11 may be not clear due to firing or the like in some cases. The element body 10 is formed as a substantially rectangular parallelepiped. The surface of the element body 10 includes a first end surface 15 and a second end surface 16 opposite to each other in the longitudinal direction of the rectangular parallelepiped, and has a bottom surface 17 intersecting with the first end surface 15 and the second end surface 16 and corresponding to one of the two surfaces opposite to each other in the height direction of the rectangular parallelepiped. The first end surface 15 and the second end surface 16 are opposite to each other in a direction orthogonal to the lamination direction A of the insulating layer 11. The first end surface 15 is a surface on which part of the first outer electrode 30 is provided, and the second end surface 16 is a surface on which part of the second outer electrode 40 is provided. The bottom surface 17 is a surface that faces the mounting substrate 51 at the time of mounting. The bottom surface 17 is a surface at which both of the other part of the first outer electrode 30 and the other part of the second outer electrode 40 are provided.

The first outer electrode 30 has an L-shape extending across the first end surface 15 and the bottom surface 17. The second outer electrode 40 has an L-shape extending across the second end surface 16 and the bottom surface 17. The first outer electrode 30 includes a plurality of outer electrode conductor layers 33 embedded in the element body 10. The second outer electrode 40 includes a plurality of outer electrode conductor layers 43 embedded in the element body 10.

Each outer electrode conductor layer 33 included in the first outer electrode 30 has an L-shape including a portion extending along the first end surface 15 and the bottom surface 17, and each outer electrode conductor layer 43 included in the second outer electrode 40 has an L-shape including a portion extending along the second end surface 16 and the bottom surface 17. With this, since the first outer electrode 30 and the second outer electrode 40 are able to be embedded in the element body 10, it is possible to reduce the size of the inductor component compared with a configuration in which the outer electrode is externally attached to the element body 10. Further, since the coil 20, the first outer electrode 30, and the second outer electrode 40 are able to be formed in the same process, variations in the positional relationship among the coil 20, the first outer electrode 30, and the second outer electrode 40 may be reduced, and it is thus possible to reduce variations in the electrical characteristics of the inductor component 1.

The coil 20 is formed of, for example, a conductive material similar to the outer electrode conductor layer 33 of the first outer electrode 30 and the outer electrode conductor layer 43 of the second outer electrode 40. The coil 20 is spirally wound along the lamination direction A of the insulating layers 11. That is, the axis of the coil 20 is parallel to the bottom surface 17 parallel to the lamination direction A, and the coil 20 has a lateral winding structure when mounted on the mounting substrate 51. The axis of the coil 20 means the central axis of the spiral shape of the coil 20. One end of the coil 20 is in contact with the first outer electrode 30, and the other end of the coil 20 is in contact with the second outer electrode 40. Note that, in the present embodiment, the coil 20 and the first and second outer electrodes 30 and 40 are integrated and there is no clear boundary therebetween. However, not being limited to this, a boundary may exist since the coil and the outer electrodes are formed by different kinds of materials or different types of processes.

The coil 20 includes a plurality of coil conductor layers 21 wound on the insulating layers 11. Thus, since the coil 20 is formed of the coil conductor layer 21 that may be finely processed, it is possible to achieve reduction in size and reduction in height of the inductor component 1. The coil conductor layers 21 adjacent to each other in the lamination direction A are connected to each other through a via conductor extending through the insulating layers 11 in the thickness direction. That is, one end of the one coil conductor layer 21 is connected to the other end of the other coil conductor layer 21. Thus, the plurality of coil conductor layers 21 form a spiral while being connected to each other. Specifically, the coil 20 has a configuration in which the plurality of coil conductor layers 21 each of which has the number of turns less than one are connected to each other and are laminated, and the coil 20 has a helical shape. With this, the parasitic capacitance generated in the coil conductor layer 21 and the parasitic capacitance generated between the coil conductor layers 21 may be reduced, and the Q factor of the inductor component 1 may be improved. Note that the number of turns of the coil conductor layer 21 may be one or more.

As illustrated in FIG. 3, the first outer electrode 30 includes an underlying layer 31 and a coating film 32. The underlying layer 31 corresponds to the outer electrode conductor layer 33 illustrated in FIG. 2, and illustration of the coating film 32 is omitted in FIG. 2.

The underlying layer 31 has an L-shape, and is embedded in the element body 10 without protruding from the element body 10 at the first end surface 15 and the bottom surface 17 of the element body 10. Specifically, part of the surface of the underlying layer 31 is embedded in the element body 10 so as to be exposed at the first end surface 15 and the bottom surface 17 of the element body 10. Here, the exposure of the underlying layer 31 at the element body 10 means that the underlying layer 31 includes a portion that is not covered by the element body 10, and the portion may be exposed to the outside of the inductor component 1 or may be exposed to another member. The underlying layer 31 is formed by, for example, baking a conductive paste including a conductive material such as Ag, Cu, Au, or an alloy containing these as a main component and a glass component.

At least part of the coating film 32 is embedded in the element body 10 at the first end surface 15 and the bottom surface 17 of the element body 10. Specifically, part of the coating film 32 protrudes from the first end surface 15 and the bottom surface 17 of the element body 10. The coating film 32 includes a first metal layer 321 covering the portion of the underlying layer 31 exposed at the element body 10, and a second metal layer 322 covering the first metal layer 321. The first metal layer 321 is embedded in the element body 10 without protruding from the element body at the first end surface 15 and the bottom surface 17 of the element body 10.

The coating film 32 is formed on the underlying layer 31 by, for example, a plating process. The first metal layer 321 is preferably a Ni layer, and it is possible to prevent dissolution of metallization of the underlying layer 31. The second metal layer 322 is preferably a Sn layer, and it is possible to improve the solder wettability of the first outer electrode 30. Note that the coating film 32 may be formed by applying a conductive resin paste, for example, or may be formed by sputtering process instead of plating process.

Similarly to the first outer electrode 30, the second outer electrode 40 includes an underlying layer 41 and a coating film 42. The underlying layer 41 is embedded in the element body 10 without protruding from the element body 10, and at least part of the coating film 42 is embedded in the element body 10 at the second end surface 16 and the bottom surface 17 of the element body 10. Specifically, part of the coating film 42 protrudes from the second end surface 16 and the bottom surface 17 of the element body 10. The coating film 42 includes a first metal layer 421 covering the underlying layer 41 and a second metal layer 422 covering the first metal layer 421, and the first metal layer 421 is embedded in the element body 10 without protruding from the element body 10 at the second end surface 16 and the bottom surface 17 of the element body 10. The underlying layer 41 and the coating film 42 are formed of the same material as the first outer electrode 30.

According to the inductor component 1, at the bottom surface 17 of the element body 10, the underlying layers 31 and 41 are embedded in the element body 10 without protruding from the element body 10, and at least part of the coating films 32 and 42 is embedded in the element body 10. With this, when the inductor component 1 is mounted on the mounting substrate 51 as illustrated in FIG. 4, that is, when an electronic component 50 is manufactured by connecting the inductor component 1 to the wire 51*a* of the mounting substrate 51 with the solder portion 52, the bottom surface 17 of the element body 10 is close to the mounting substrate 51, the position of the center of gravity of the inductor component 1 may be lowered, and it is possible to stabilize the mounting posture of the inductor component 1.

Further, at the first end surface 15 and the second end surface 16 of the element body 10, the underlying layers 31 and 41 are embedded in the element body 10 without protruding from the element body 10, and at least part of the coating films 32 and 42 is embedded in the element body 10. Therefore, the first outer electrode 30 and the second outer electrode 40 are less likely to be caught at the first end surface 15 and the second end surface 16, and the first outer electrode 30 and the second outer electrode 40 are less likely to come off the element body 10.

Further, since the first metal layers 321 and 421 are embedded in the element body 10, it is possible to prevent the first metal layers 321 and 421 from peeling off the element body 10. Thus, for example, when the Ni layer is used as the first metal layers 321 and 421, it is possible to prevent the Ni layer from peeling off, and the Ni layer may prevent dissolution of metallization of the underlying layers 31 and 41.

The coating film 32 of the first outer electrode 30 includes a Ni layer as the first metal layer 321 covering the underlying layer 31, and a Sn layer as the second metal layer 322 covering the Ni layer. The coating film 42 of the second outer electrode 40 includes a Ni layer as the first metal layer 421 covering the underlying layer 41, and a Sn layer as the second metal layer 422 covering the Ni layer. When the first outer electrode 30 and the second outer electrode 40 of the inductor component 1 are connected to the mounting substrate 51, the Sn layer of the coating films 32 and 42 are fused with the solder material, and the solder portion 52 is formed.

At this time, the electronic component 50 includes the inductor component 1 and the mounting substrate 51 on which the inductor component 1 is mounted. The coating films 32 and 42 of the first outer electrode 30 and the second outer electrode 40 of the inductor component 1 include the Ni layer covering the underlying layers 31 and 41. The electronic component 50 includes the solder portion 52, and the solder portion 52 covers the Ni layer, connects the mounting substrate 51 and the Ni layer, and contains Sn.

With this, the bottom surface 17 of the element body 10 is close to the mounting substrate 51, and the position of the center of gravity of the inductor component 1 may further be lowered, and it is thus possible to further stabilize the mounting posture of the inductor component 1.

Note that the bottom surface (coating films 32 and 42) of the outer electrodes 30 and 40 may have a flat surface, or may have unevenness. When the bottom surface of the outer electrodes 30 and 40 have unevenness, the surface area of the bottom surface of the outer electrodes 30 and 40 (coating films 32 and 42) increases. In addition, when the bottom surface of the outer electrodes 30 and 40 has a dent, the solder gathers therein and a strength at joining is improved and the mounting posture becomes stable.

Further, when the bottom surface 17 of the element body 10 is viewed, the bottom surface of the outer electrodes 30 and 40 has a rectangular shape, but may have a T-shape, or the edge of the bottom surface of the outer electrodes 30 and 40 may have a comb-tooth shape having continuous unevenness.

Further, the Sn layer of the coating films 32 and 42 is fused with the solder material to form the solder portion 52, but the coating film does not necessarily include the Sn layer, and in that case, part of the coating film does not have to be fused with the solder material.

Manufacturing Method

A manufacturing method for the inductor component 1 is described with reference to FIG. 2.

First, a first insulating layer (corresponding to an insulating layer 11 in FIG. 2) is formed. Specifically, an insulating paste such as glass is applied to a substrate such as a carrier film, and the entire surface of the insulating paste is exposed to ultraviolet rays. The insulating layer 11 serving as a marker layer may be provided as a lowermost layer or an uppermost layer of the element body 10, and the marker layer preferably has a color different from the color of the insulating layers 11 other than the marker layer so as to detect such as the rollover of the inductor component 1 at the time of mounting.

Next, the coil conductor layer 21 is formed on the first insulating layer. Specifically, a photosensitive conductive paste is applied to the first insulating layer by printing, and the coil conductor layer 21 is formed by photolithography method. The outer electrode conductor layers 33 and 43 are formed at the same time. The number of layers, the thickness, and the number of turns of the coil conductor layer 21 are set to a desired value according to the L value to be obtained.

Subsequently, a second insulating layer (corresponding to an insulating layer 11 in FIG. 2) is formed on the coil conductor layer 21. Specifically, the second insulating layer having a via hole and an outer electrode groove is formed on the coil conductor layer 21 by photolithography method or the like. After that, by forming the coil conductor layer 21 and the outer electrode conductor layers 33 and 43 on the second insulating layer again, the via hole and the outer electrode groove are filled with the conductive paste. The coil conductor layers 21 adjacent to each other in the lamination direction A are connected with the conductive paste in the via hole, and the outer electrode conductor layers 33 adjacent to each other in the lamination direction A are connected and the outer electrode conductor layers 43 adjacent to each other in the lamination direction A are connected with the conductive paste in the outer electrode groove. Note that, there may be an insulating layer 11 where the coil conductor layer 21 is not provided depending on the setting of the number of layers of the coil conductor layer 21. In that case, the via hole is not formed and the outer electrode groove alone is formed in the shape following the shape of the outer electrode.

Further, the extended conductor layers are connected to at least the lowermost layer and the uppermost layer of the coil conductor layer 21, and are connected to the outer electrode conductor layers 33 and 43, which are opposite to each other, respectively. It is preferable that the shape of the coil 20 have a 180° rotational symmetricity so as not to be affected by the directivity of a product.

The above-described steps are repeated to laminate the plurality of insulating layers 11, the plurality of coil conductor layers 21, and the plurality of outer electrode conductor layers 33 and 43. Subsequently, the multilayer body is cut with a dicing machine, guillotine shearing machine, or the like, and is divided into individual pieces. The divided multilayer body is fired to be formed in a desired size.

Here, an insulating material or a magnetic material is coated to the surface of the element body 10 other than the outer electrode conductor layers 33 and 43 so that the outer electrode conductor layers 33 and 43 (the underlying layers 31 and 41) are embedded in the element body 10. The coating to the portion other than the outer electrode conductor layers 33 and 43 is performed by masking, punching, etching with a laser, a solvent, or the like. Alternatively, the portion of the outer electrode conductor layers 33 and 43 protruding from the element body 10 is pared by punching, etching with a laser, a solvent, or the like so that the outer electrode conductor layers 33 and 43 (underlying layers 31 and 41) are embedded in the element body 10. Alternatively, the outer electrode conductor layers 33 and 43 (underlying layers 31 and 41) are embedded in the element body 10 due to a difference in firing shrinkage during firing between the outer electrode conductor layers 33 and 43 and the insulating layer 11. Specifically, by making the shrinkage ratio of the outer electrode conductor layers 33 and 43 larger than the shrinkage ratio of the insulating layer 11, the shrinkage ratio of the element body 10 becomes smaller than the shrinkage ratio of the outer electrode conductor layers 33 and 43 by the firing.

Subsequently, the inductor component 1 is manufactured such that Ni, Cu, Sn, or the like is plated on the exposed portion of the outer electrode conductor layers 33 and 43 at the element body 10, and the coating films 32 and 42 are formed. Note that although the photolithography method is described above, a lamination method, a semi-additive method, or the like may be adopted and the methods are not limited.

Second Embodiment

Figure 5:
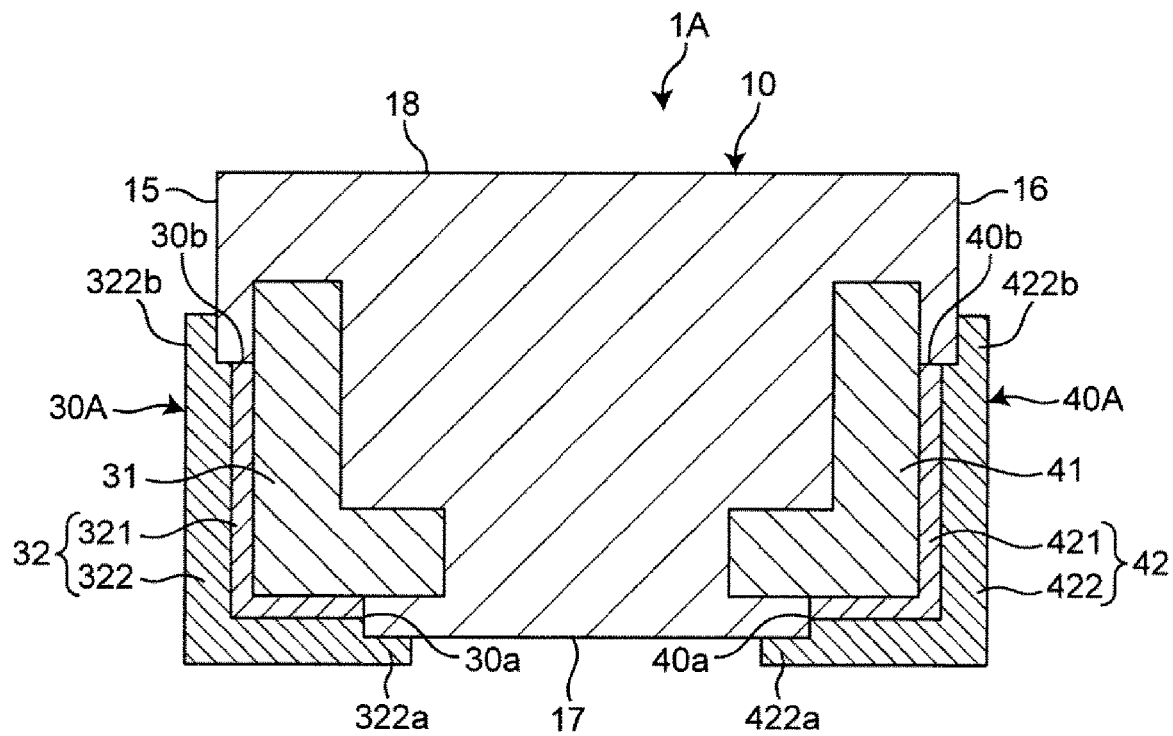
FIG. 5 is a sectional view illustrating a second embodiment of the inductor component.

FIG. 5 is a sectional view illustrating a second embodiment of the inductor component. The second embodiment is different from the first embodiment in the configuration of the outer electrodes. This different configuration is described below. The other configurations are the same as those in the first embodiment, and the same reference numerals as in the first embodiment are given and description thereof is omitted.

As illustrated in FIG. 5, in a first outer electrode 30A of an inductor component 1A of the second embodiment, part of the coating film 32 protrudes from the bottom surface 17 of the element body 10, and part of the coating film 32 includes a first overhanging portion 322a that overhangs on the bottom surface 17 of the element body 10 and covers the bottom surface 17 of the element body 10. Specifically, part of the second metal layer 322 protrudes from the bottom surface 17 of the element body 10, and further includes the first overhanging portion 322a that overhangs on the bottom surface 17 of the element body 10. The first overhanging portion 322a protrudes toward the second end surface 16. The first overhanging portion 322a may be provided to the underlying layer 31 in the entire length along the axial direction of the coil 20 (along the direction from front to back of the paper), or may be provided to the underlying layer 31 in part of the entire length.

With the inductor component 1A, since part of the coating film 32 protrudes from the bottom surface 17 of the element body 10 and further includes the first overhanging portion 322a, the surface area of the coating film 32 on the bottom surface 17 of the element body 10 may be increased. Thus, when the inductor component 1A is mounted on the mounting substrate 51, the surface area of the coating film 32 facing the mounting substrate 51 may be increased, the contact area with the solder portion 52 may be increased, and the fixing force of the inductor component 1A to the mounting substrate 51 is improved.

Figure 6:
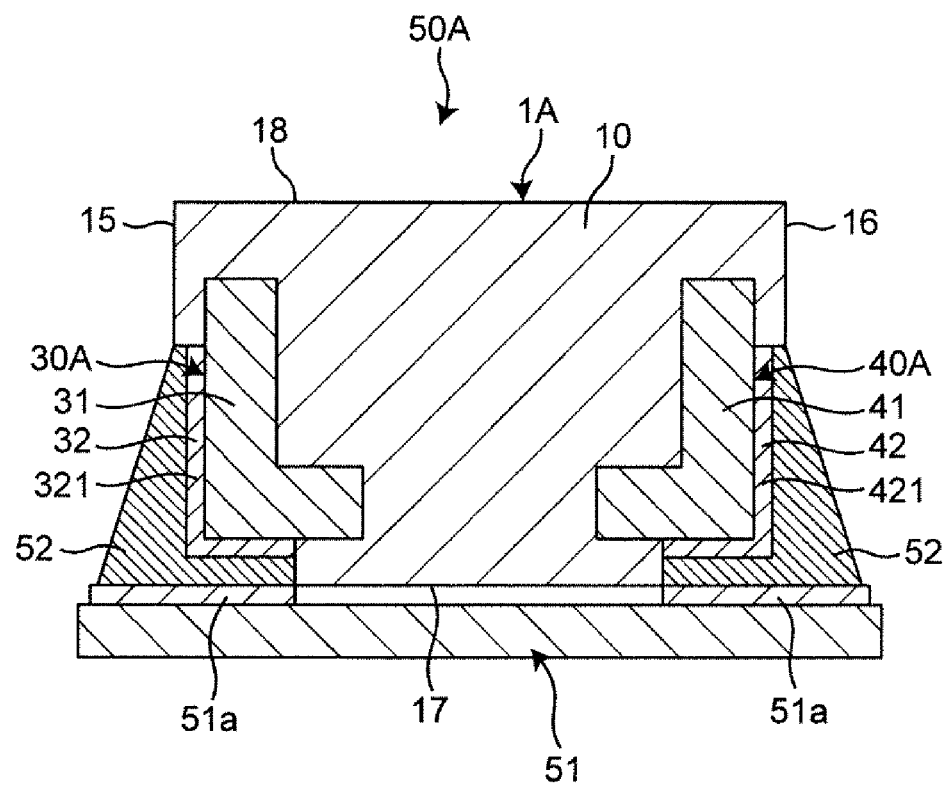
FIG. 6 is a sectional view illustrating a state in which the inductor component is mounted on a mounting substrate.

Further, since part of the second metal layer 322 is embedded in the element body 10, in a case where the second metal layer 322 is a Sn layer, as illustrated in FIG. 6, when the inductor component 1A is mounted on the mounting substrate 51 and an electronic component 50A is assembled, the Sn layer of the second metal layer 322 fuses with the solder material, and the solder portion 52 is formed. Thus, the solder portion 52 extends into the element body 10, and the bottom surface 17 of the element body 10 is further closer to the mounting substrate 51 to further lower the position of the center of gravity of the inductor component 1A, and it is thus possible to further stabilize the mounting posture of the inductor component 1A.

Similarly, in a second outer electrode 40A, part of the coating film 42 (part of the second metal layer 422) protrudes from the bottom surface 17 of the element body 10, and part of the coating film 42 (part of the second metal layer 422) includes a first overhanging portion 422a that overhangs on the bottom surface 17 of the element body 10 and covers the bottom surface 17 of the element body 10. With this, the same effects as those of the first outer electrode 30A are obtained.

Further, in the first outer electrode 30A, part of the coating film 32 (part of the second metal layer 322) protrudes from the first end surface 15 of the element body 10, and part of the coating film 32 (part of the second metal layer 322) includes a second overhanging portion 322b that overhangs on the first end surface 15 of the element body 10 and covers the first end surface 15 of the element body 10. The second overhanging portion 322b protrudes toward a top surface 18. With this, the surface area of the coating film 32 may be increased, and the contact area with the solder portion 52 may be increased.

Similarly, in the second outer electrode 40A, part of the coating film 42 (part of the second metal layer 422) protrudes from the second end surface 16 of the element body 10, and part of the coating film 42 (part of the second metal layer 422) includes a second overhanging portion 422b that overhangs on the second end surface 16 of the element body 10 and covers the second end surface 16 of the element body 10. With this, the same effects as those of the first outer electrode 30A are obtained.

As illustrated in FIG. 5, the first outer electrode 30A includes a first recessed portion 30a to which part of the element body 10 extends between the underlying layer 31 and the first overhanging portion 322a at the bottom surface 17 of the element body 10. That is, the end surface of the first metal layer 321 toward the second end surface 16 constitutes the bottom surface of the first recessed portion 30a. Since the underlying layer 31 and the first overhanging portion 322a sandwich the part of the element body 10, the first outer electrode 30A is less likely to come off the element body 10.

Further, the first outer electrode 30A includes a second recessed portion 30b to which the part of the element body 10 extends between the underlying layer 31 and the second overhanging portion 322b at the first end surface 15 of the element body 10. Since the underlying layer 31 and the second overhanging portion 322b sandwich the part of the element body 10, the first outer electrode 30A is less likely to come off the element body 10.

Similarly, the second outer electrode 40A includes a first recessed portion 40a to which part of the element body 10 extends between the underlying layer 41 and the first overhanging portion 422a at the bottom surface 17 of the element body 10. Since the underlying layer 41 and the first overhanging portion 422a sandwich the part of the element body 10, the second outer electrode 40A is less likely to come off the element body 10.

Further, the second outer electrode 40A includes a second recessed portion 40b to which the part of the element body 10 extends between the underlying layer 41 and the second overhanging portion 422b at the second end surface 16 of the element body 10. Since the underlying layer 41 and the second overhanging portion 422b sandwich the part of the element body 10, the second outer electrode 40A is less likely to come off the element body 10.

Third Embodiment

Figure 7:
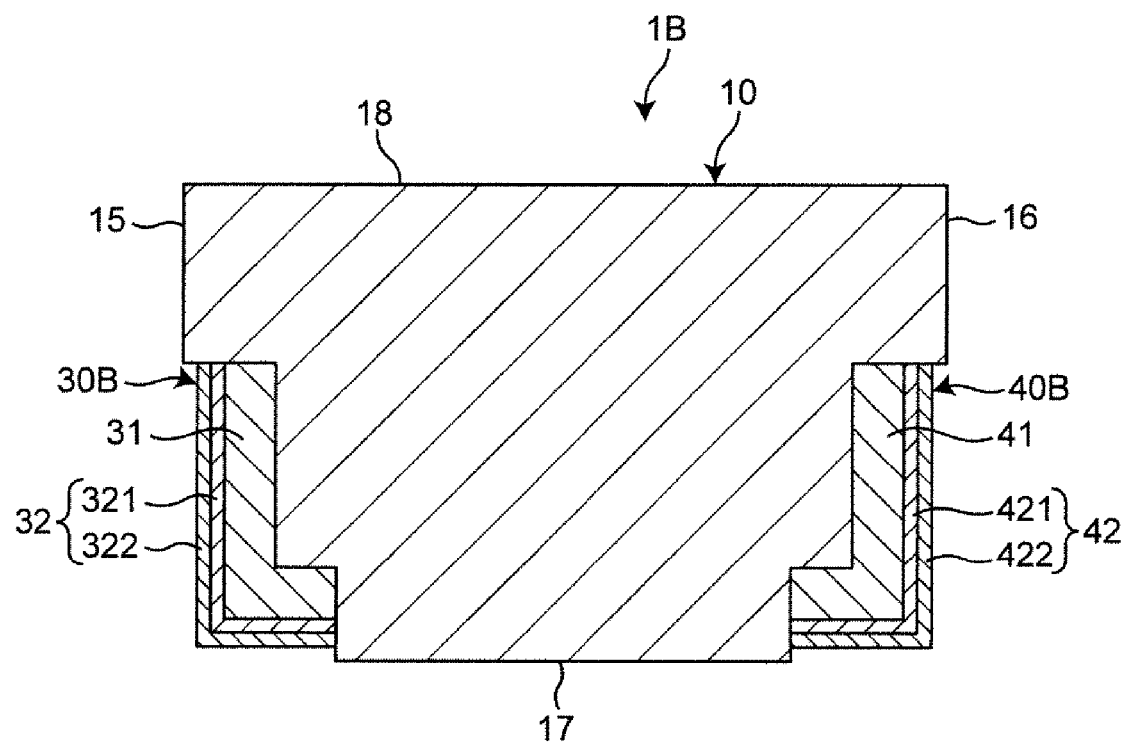
FIG. 7 is a sectional view illustrating a third embodiment of the inductor component.

FIG. 7 is a sectional view illustrating a third embodiment of the inductor component. The third embodiment is different from the first embodiment in the configuration of the outer electrodes. This different configuration is described below. The other configurations are the same as those in the first embodiment, and the same reference numerals as in the first embodiment are given and description thereof is omitted.

As illustrated in FIG. 7, in an inductor component 1B of the third embodiment, the coating film 32 of a first outer electrode 30B is embedded in the element body 10 without protruding from the element body 10 at the bottom surface 17 of the element body 10. With this, the first outer electrode 30B does not protrude from the bottom surface 17 of the element body 10. Thus, at the time of transport or the like of the inductor component 1B, other members do not hit the first outer electrode 30B at the bottom surface 17 of the element body 10, and it is possible to prevent the first outer electrode 30B from detaching from the element body 10.

Figure 8:
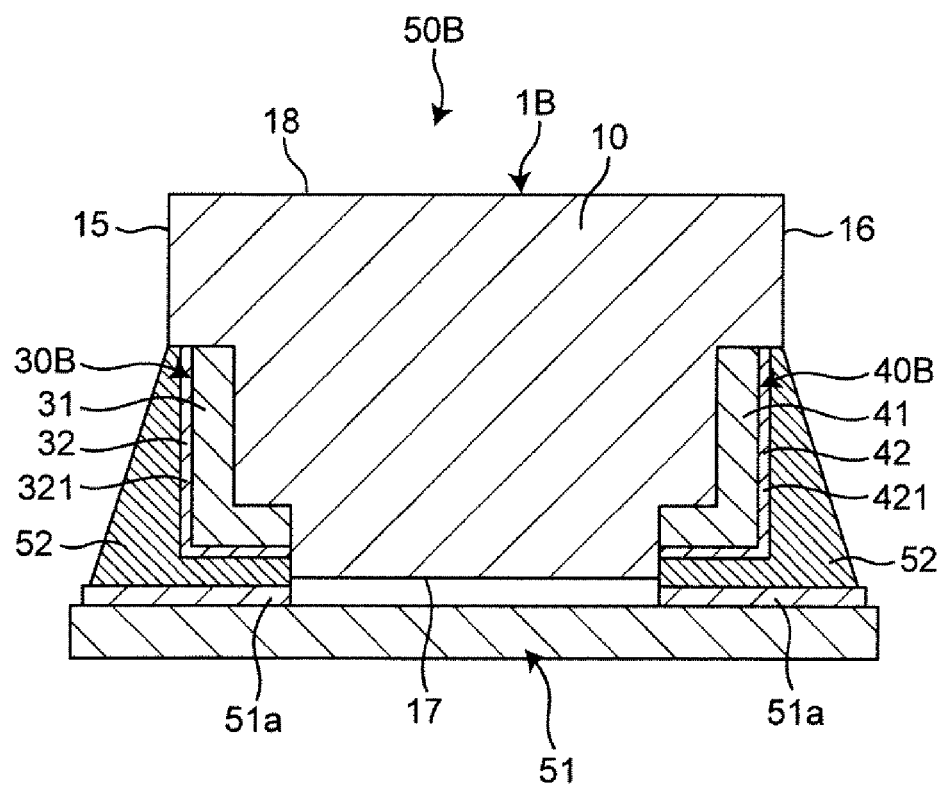
FIG. 8 is a sectional view illustrating a state in which the inductor component is mounted on a mounting substrate.

Further, since the second metal layer 322 is embedded in the element body 10, in a case where the second metal layer 322 is a Sn layer, as illustrated in FIG. 8, when the inductor component 1B is mounted on the mounting substrate 51 and an electronic component 50B is assembled, the Sn layer of the second metal layer 322 is fused with the solder material and the solder portion 52 is formed. Thus, the solder portion 52 extends into the element body 10, the bottom surface 17 of the element body 10 is further closer to the mounting substrate 51 to further lower the position of the center of gravity of the inductor component 1B, and it is possible to further stabilize the mounting posture of the inductor component 1B.

Similarly, in a second outer electrode 40B, the coating film 42 is embedded in the element body 10 without protruding from the element body 10 at the bottom surface 17 of the element body 10. With this, the same effects as those of the first outer electrode 30B are obtained.

Further, the coating film 32 of the first outer electrode 30B is embedded in the element body 10 without protruding from the element body 10 at the first end surface 15 of the element body 10. Thus, at the time of transport or the like of the inductor component 1B, other members do not hit the first outer electrode 30B at the first end surface 15 of the element body 10, and it is possible to prevent the first outer electrode 30B from detaching from the element body 10.

Similarly, the coating film 42 of the second outer electrode 40B is embedded in the element body 10 without protruding from the element body 10 at the second end surface 16 of the element body 10. With this, the same effects as those of the first outer electrode 30B are obtained.

Fourth Embodiment

Figure 9:
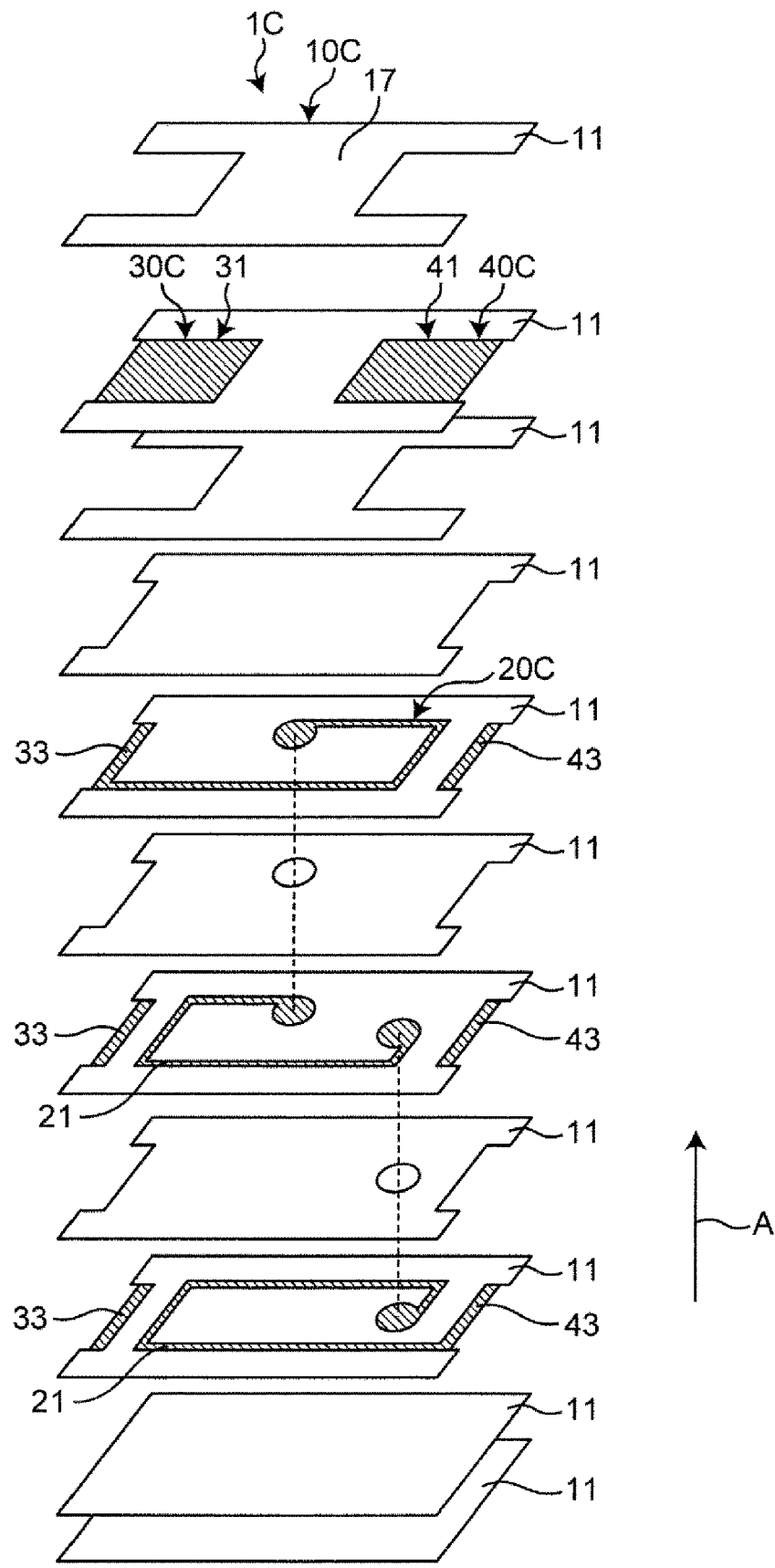
FIG. 9 is an exploded perspective view illustrating a fourth embodiment of the inductor component.

FIG. 9 is an exploded perspective view illustrating a fourth embodiment of the inductor component. The fourth embodiment is different from the first embodiment in the configuration of the element body, the outer electrode, and the coil. This different configuration is described below. The other configurations are the same as those in the first embodiment, and the same reference numerals as in the first embodiment are given and description thereof is omitted. In FIG. 9, the coating film 32 is omitted as in FIG. 2.

As illustrated in FIG. 9, in an inductor component 1C of the fourth embodiment, the element body 10C includes the plurality of insulating layers 11 laminated in the lamination direction A, and the uppermost insulating layer 11 in FIG. 9 constitutes the bottom surface 17 of an element body 10C. The coil conductor layer 21 constituting a coil 20C, the outer electrode conductor layer 33 constituting a first outer electrode 30C, and the outer electrode conductor layer 43 constituting a second outer electrode 40C are provided on a predetermined insulating layer 11.

The axis of the coil 20C is orthogonal to the bottom surface 17 of the element body 10C, and the coil 20C has a longitudinal winding structure. The outer electrode conductor layer 33 (underlying layer 31) of the first outer electrode 30C is not formed on the uppermost insulating layer 11, and does not protrude from the bottom surface 17 of the element body 10C. Similarly, the outer electrode conductor layer 43 (underlying layer 41) of the second outer electrode 40C is not formed on the uppermost insulating layer 11, and does not protrude from the bottom surface 17 of the element body 10C.

Further, the outer electrode conductor layers 33 and 43 (underlying layers 31 and 41) are embedded in the element body 10 so as not to protrude from the element body 10 at the bottom surface 17 and the end surfaces 15 and 16 of the element body 10 due to the difference in firing shrinkage during firing between the outer electrode conductor layers 33 and 43 and the insulating layer 11. Specifically, by making the shrinkage ratio of the outer electrode conductor layers 33 and 43 larger than the shrinkage ratio of the insulating layer 11, the shrinkage ratio of the element body 10 becomes smaller than the shrinkage ratio of the outer electrode conductor layers 33 and 43 by the firing.

Subsequently, the inductor component 1C is manufactured such that Ni, Cu, Sn, or the like is plated on the exposed portion of the outer electrode conductor layers 33 and 43 at the element body 10, and the coating films 32 and 42 are formed.

According to the inductor component 1C, as in the aforementioned first embodiment, the underlying layers 31 and 41 are embedded in the element body 10 without protruding from the element body 10 at the bottom surface 17 of the element body 10, and at least part of the coating films 32 and 42 is embedded in the element body 10. With this, it is possible to stabilize the mounting posture of the inductor component 1C.

It should be noted that the present disclosure is not limited to the above-described embodiments, and design changes may be made without departing from the gist of the present disclosure. For example, the features of the first to fourth embodiments may be variously combined with each other.

In the aforementioned embodiments, at the bottom surface and the end surfaces of the element body, the underlying layer is embedded in the element body without protruding from the element body and at least part of the coating film is embedded in the element body. However, it is sufficient that, only at the bottom surface of the element body, the underlying layer is embedded in the element body without protruding from the element body and at least part of the coating film is embedded in the element body.

In the embodiments, the outer electrode has an L-shape extending across the end surface and the bottom surface, but may be a bottom surface electrode provided only on the bottom surface.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor component comprising:
an element body including a bottom surface that faces a mounting substrate when the element body is mounted;
a coil provided in the element body; and
an outer electrode provided to the element body and electrically connected to the coil, the outer electrode including an underlying layer and a coating film that covers the underlying layer, and
wherein at the bottom surface of the element body, the underlying layer is embedded in the element body without protruding from the element body, and at least part of the coating film is embedded in the element body.

2. The inductor component according to claim 1, wherein part of the coating film protrudes from the bottom surface.

3. The inductor component according to claim 1, wherein part of the coating film includes a first overhanging portion that overhangs on the bottom surface.

4. The inductor component according to claim 3, wherein the outer electrode includes a first recessed portion to which part of the element body extends between the underlying layer and the first overhanging portion.

5. The inductor component according to claim 1, wherein the coating film is embedded in the element body without protruding from the element body at the bottom surface.

6. The inductor component according to claim 1, wherein the element body includes an end surface intersecting with the bottom surface, and
at the end surface of the element body, the underlying layer is embedded in the element body without protruding from the element body, and at least part of the coating film is embedded in the element body.

7. The inductor component according to claim 6, wherein part of the coating film protrudes from the end surface of the element body.

8. The inductor component according to claim 6, wherein part of the coating film includes a second overhanging portion that overhangs on the end surface of the element body.

9. The inductor component according to claim 8, wherein the outer electrode includes a second recessed portion to which part of the element body extends between the underlying layer and the second overhanging portion.

10. The inductor component according to claim 6, wherein
the coating film is embedded in the element body without protruding from the element body at the end surface of the element body.

11. The inductor component according to claim 1, wherein
the coating film includes a first metal layer covering the underlying layer and a second metal layer covering the first metal layer, and
the first metal layer is embedded in the element body without protruding from the element body at the bottom surface of the element body.

12. The inductor component according to claim 11, wherein
the first metal layer is a Ni layer and the second metal layer is a Sn layer.

13. An electronic component comprising:
the inductor component according to claim 1; and
a mounting substrate on which the inductor component is mounted, wherein
the coating film of the outer electrode of the inductor component includes a Ni layer that covers the underlying layer, and
the electronic component includes a solder portion that contains Sn, covers the Ni layer, and connects the mounting substrate and the Ni layer.

14. The inductor component according to claim 2, wherein
part of the coating film includes a first overhanging portion that overhangs on the bottom surface.

15. The inductor component according to claim 2, wherein
the element body includes an end surface intersecting with the bottom surface, and
at the end surface of the element body, the underlying layer is embedded in the element body without protruding from the element body, and at least part of the coating film is embedded in the element body.

16. The inductor component according to claim 3, wherein
the element body includes an end surface intersecting with the bottom surface, and
at the end surface of the element body, the underlying layer is embedded in the element body without protruding from the element body, and at least part of the coating film is embedded in the element body.

17. The inductor component according to claim 7, wherein part of the coating film includes a second overhanging portion that overhangs on the end surface of the element body.

18. The inductor component according to claim 7, wherein the coating film is embedded in the element body without protruding from the element body at the end surface of the element body.

19. The inductor component according to claim 2, wherein the coating film includes a first metal layer covering the underlying layer and a second metal layer covering the first metal layer, and the first metal layer is embedded in the element body without protruding from the element body at the bottom surface of the element body.

20. An electronic component comprising:

the inductor component according to claim 2; and a mounting substrate on which the inductor component is mounted, wherein the coating film of the outer electrode of the inductor component includes a Ni layer that covers the underlying layer, and the electronic component includes a solder portion that contains Sn, covers the Ni layer, and connects the mounting substrate and the Ni layer.

\* \* \* \* \*